(12) United States Patent
Verschuuren et al.

(10) Patent No.: US 9,647,182 B2
(45) Date of Patent: May 9, 2017

(54) ENHANCED EMISSION FROM PLASMONIC COUPLED EMITTERS FOR SOLID STATE LIGHTING

(71) Applicant: KONINKLIJKE PHILIPS N.V., Eindhoven (NL)

(72) Inventors: Marcus Antonius Verschuuren, Eindhoven (NL); Gabriel Sebastian Lozano Barbero, Eindhoven (NL); Jaime Gómez Rivas, Eindhoven (NL); Dirk Kornelis Gerhardus De Boer, Eindhoven (NL); Rifat Ata Mustafa Hikmet, Eindhoven (NL); Ties Van Bommel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/909,864

(22) PCT Filed: Jul. 22, 2014

(86) PCT No.: PCT/IB2014/063293
§ 371 (c)(1),
(2) Date: Feb. 3, 2016

(87) PCT Pub. No.: WO2015/019220
PCT Pub. Date: Feb. 12, 2015

(65) Prior Publication Data
US 2016/0190403 A1    Jun. 30, 2016

(30) Foreign Application Priority Data

Aug. 6, 2013 (EP) .......... 13179357
Jan. 3, 2014 (EP) .......... 14150097

(51) Int. Cl.
*H01L 33/00* (2010.01)
*H01L 33/50* (2010.01)
*H01L 33/58* (2010.01)

(52) U.S. Cl.
CPC .......... *H01L 33/508* (2013.01); *H01L 33/504* (2013.01); *H01L 33/58* (2013.01)

(58) Field of Classification Search
CPC .................................................. H01L 33/504
(Continued)

(56) References Cited

U.S. PATENT DOCUMENTS

| 7,999,353 B1 | 8/2011 | Odom et al. | |
| 2010/0126566 A1* | 5/2010 | Ji | G02B 5/008 136/252 |

(Continued)

FOREIGN PATENT DOCUMENTS

| EP | 2133688 A1 | 12/2009 |
| EP | 2477240 A1 | 7/2012 |
| WO | 2011050272 A2 | 4/2011 |

OTHER PUBLICATIONS

EPO as ISA, PCT/IB2014/063293, filed Jul. 22, 2014, "International Search Report and Written Opinion" dated Nov. 12, 2014, 10 pages.

*Primary Examiner* — Igwe U Anya

(57) ABSTRACT

There is provided an illumination device (100) comprising an energy source (102) for exciting a photon emitter; a first wavelength conversion layer (104) and a second wavelength conversion layer (106). At least one of the first and second wavelength conversion layer comprises a periodic plasmonic antenna array comprising a plurality of individual antenna elements (108). The wavelength converting medium in the wavelength conversion layer in which the antenna array is arranged comprises photon emitters arranged in close proximity of the plasmonic antenna array such that at (Continued)

least a portion of photons emitted from the wavelength conversion layer are emitted by a coupled system comprising the photon emitter and the plasmonic antenna array. The plasmonic antenna array is configured to support plasmonic-photonic lattice resonances at a frequency range corresponding to the wavelength range of the photon emitter in the layer in which the plasmonic antenna array is arranged, such that light emitted from the plasmonic antenna array has an anisotropic angle distribution.

15 Claims, 2 Drawing Sheets

(58) Field of Classification Search
USPC .......................................................... 257/98
See application file for complete search history.

(56) References Cited

U.S. PATENT DOCUMENTS

| | | | | |
|---|---|---|---|---|
| 2010/0126567 A1* | 5/2010 | Kaufman | ............... | G02B 5/008 |
| | | | | 136/252 |
| 2011/0294295 A1 | 12/2011 | Zhu et al. | | |
| 2013/0286633 A1* | 10/2013 | Rodriguez | .............. | H01L 33/50 |
| | | | | 362/84 |

\* cited by examiner

ENHANCED EMISSION FROM PLASMONIC COUPLED EMITTERS FOR SOLID STATE LIGHTING

CROSS-REFERENCE TO RELATED APPLICATIONS

The present application is a §371 application of International Application No. PCT/IB2014/063293 filed on Jul. 22, 2014 and entitled "ENHANCED EMISSION FROM PLASMONIC COUPLED EMITTERS FOR SOLID STATE LIGHTING," which claims priority to European Application Nos. 13179357.2, filed Aug. 6, 2013 and 14150097.5, filed Jan. 3, 2014. PCT/IB2014/063293, 13179357.2, and 14150097.5 are incorporated herein.

FIELD OF THE INVENTION

The present invention relates to an illumination device. In particular, the present invention related to an illumination device having improved emission efficiency.

TECHNICAL BACKGROUND

For light emitting diodes (LEDs) for use in lighting applications, it is desirable to provide essentially white light having a color temperature approximately comparable to that produced by incandescent lighting.

White light from LEDs is commonly provided by using a pn-diode emitting blue light, having a wavelength around 450 nm, where part of the blue light is converted to longer wavelengths using one or more wavelength converting materials arranged on top of or in the vicinity of the diode. Together with the blue light which is not absorbed, light having a reasonably broadband spectrum which is perceived as white light can be obtained.

Currently, in most commercial applications, the wavelength converting material is applied directly on the LED. Furthermore, the wavelength converting material should be scattering in order to obtain a low variation in color over angle. This means that blue light will also be scattered back into the diode which leads to absorption losses in the LED. Moreover, the active component of the wavelength converting material, commonly phosphor, is an isotropic emitter, meaning that the same amount of wavelength converted light is emitted in all directions, leading to further losses as only a portion of the light reaches the surface of the light emitting device.

The problem of reducing losses has for example been addressed by using a phosphor which is less scattering to reduce the amount of blue light which is backscattered and absorbed by the diode. However, the isotropic emission from the phosphor remains.

The amount of light leaving the light emitting device may also be increased by introducing a photonic band gap material in which the emission direction can be modified. However, to be able to control the emission direction, a photonic band gap material needs to be made from materials having a high refractive index contrast, high aspect ratio holes or pillars must be patterned and formed, the size control is very strict and the material must be luminescent which will incur scattering losses. Furthermore, a photonic band gap material is only really effective in the plane perpendicular to the surface of the material, i.e. in a direction parallel to the holes or pillars.

Accordingly, the suggested approaches for increasing the emission efficiency of a light emitting device suffer from inherent drawbacks which are hard to overcome.

SUMMARY OF THE INVENTION

In view of the above-mentioned desired properties of a light emitting device, and the above-mentioned and other drawbacks of the prior art, it is an object of the present invention to provide an improved light emitting device.

According to a first aspect of the present invention, it is therefore provided an illumination device comprising: an energy source configured to excite a photon emitter such that the photon emitter may emit a photon when returning to a relaxed state; a first wavelength conversion layer comprising a first wavelength converting medium configured to convert light within the first wavelength range into light within a second wavelength range; and a second wavelength conversion layer comprising a second wavelength converting medium configured to convert light within the second wavelength range into light within a third wavelength range; wherein at least one of the first wavelength conversion layer and the second wavelength conversion layer comprises a periodic plasmonic antenna array comprising a plurality of individual antenna elements arranged in an antenna plane; and wherein the wavelength converting medium in the wavelength conversion layer in which the plasmonic antenna array is arranged comprises photon emitters arranged in close proximity of the plasmonic antenna array such that at least a portion of photons emitted from the wavelength conversion layer are emitted by a coupled system comprising the photon emitter and the plasmonic antenna array; the plasmonic antenna array being configured to support plasmonic-photonic lattice resonances at a frequency range corresponding to the wavelength range of the photon emitter in the layer in which the plasmonic antenna array is arranged, such that light emitted from the plasmonic antenna array has an anisotropic angle distribution.

The field of plasmonics refers to the interaction of small conducting structures, typically metal structures, with light, whereby the size of the metal structures is similar to the wavelength of the light. The free electrons in the metal respond to an external electric field and the electron cloud oscillates at the driving optical frequency, leaving behind a more positive charged area, which pulls the electrons back. Due the small size of the metal structures, the resonances can reach the frequencies of visible light. As a result, a metal structure can have a large scatter cross-section which allows a strong interaction with any light that is incident on them or light that is generated in close proximity to the metal particles.

It has been found that a conversion material located in the proximity of a regular array exhibits strong enhancement in directionality of the emission which is attributed to hybrid coupled LSPR (Localized Surface Plasmon Resonance) and photonic modes.

Ordered arrays of optical antennas support collective resonances. When the wavelength of the emission is on the order of the periodicity of the array, a diffracted order can radiate in the plane of the array. This way the localized surface plasmon polaritons sustained by the individual particles may couple via diffraction leading to collective, lattice-induced, hybrid photonic-plasmonic resonances known as surface lattice resonances (SLRs). These delocalized modes extend over several unit cells, making it possible to obtain a collective enhancement of the emission from emitters distributed over large volumes as it is required in solid-state lighting.

Here, use is made of periodic arrays of nanoparticles that behave as collective nano-antennas. Such arrays sustain collective plasmonic resonances. On the one hand, metallic nanoparticles have large scattering cross sections that allow resonant excitation of phosphors in the wavelength conversion material, enhancing the conversion of light. On the other hand, collective photonic-plasmonic resonances enable shaping the angular pattern of the emission, beaming most of the light into a very narrow angular range in a defined direction. Therefore, the anisotropic emission is explained as the combination of an increased efficiency in the excitation of the wavelength conversion medium and an enhancement of the out-coupling efficiency of the emission of the phosphors to extended plasmonic-photonic modes in the array and the subsequent out-coupling of this emission to free-space radiation. A more detailed description of the function of the plasmonic antenna array can be found in WO2012/098487.

The present invention is based on the realization that it is advantageous to form an illumination device comprising at least one plasmonic antenna array to provide an increased directionality of light emitted by the device, and that the sequence of wavelength conversion layers in such an illumination device comprising a plasmonic antenna array is important as it influences the overall efficiency of the illumination device. Furthermore, the anisotropic angle distribution makes it possible to also control the directionality of light emitted by the antenna array so that a majority of light is emitted in a relatively narrow angle range in relation to the plane of the antenna array. This may be particularly advantageous in applications where it is desirable to direct the emitted light in predetermined desirable directions. Accordingly, plasmonic antenna arrays can be integrated in lighting devices as efficient and compact secondary collimating optics. Light emitted within a narrow angle range can also be referred to as beamed light.

Furthermore, the antenna array is formed as a regular lattice of antenna elements exhibiting long range symmetry. However a certain degree of asymmetry of the antenna array can be allowed while still achieving the desired effect of anisotropic light distribution.

The resonance frequency and bandwidth of the antenna array is governed by the distribution of antenna elements, i.e. the lattice, the geometry of antenna elements, the material from which the antenna elements are formed and by the materials and configuration of layers in the proximity of the antenna array. Thereby, a desired resonance frequency and bandwidth can be achieved by tuning the aforementioned parameters. In general, there is a tradeoff between bandwidth and directionality enhancement, meaning that an antenna array having resonances in a narrow frequency band exhibit a larger directionality enhancement compared to an antenna array having a more broadband resonance. A narrow frequency band can in the present context be understood as resonance frequencies corresponding to a wavelength range of a few nanometers. Plasmonic antenna arrays may therefore be useful for replacing collimating optics.

Plasmonic antenna arrays for increasing the directionality of emitted light also provide advantages in view of for example photonic crystals which require careful tuning of layer thickness and size.

A particular advantage of the present invention is that by arranging a photon emitter in the wavelength conversion layer, where the plasmonic antenna array is located, such that the spatial extension of the hybrid coupled LSPR and photonic modes of the plasmonic antenna array overlaps the photon emitter, coupling between the emitted photon and the plasmonic antenna array occurs such that the direction of the emitted photon is controlled by the plasmonic antenna array in the same manner as discussed above.

Accordingly, for a photon emitter arranged such that coupling occurs between the photon emitter and the plasmonic antenna array, an emitted photon may be seen as being emitted from the coupled system comprising the photon emitter and plasmon antenna array. In general, the photon emitter in an excited state may either emit a photon directly, or through coupled emission where coupling occurs between the photon emitter and modes of the plasmonic antenna array.

In applications where an ensemble of photon emitters is used, and where the individual photon emitters have different emission wavelengths, the plasmonic antenna array may be configured such that the directionality of a particular wavelength is enhanced, thereby making it possible to also control the resulting spectra being emitted from the illumination device, at least for the particular emission angle range determined by the antenna array.

A photon emitter should be understood as any atom, molecule, particle or structure which is capable of being elevated in energy to an excited state through addition of energy, and where relaxation into a state of lower energy takes place through the emission of a photon.

In general, the photoluminescence enhancement (PLE), defined as the photoluminescence intensity measured from the photon emitter deposited over the array normalized by the photoluminescence of the same photon emitter in the absence of the array, accounts for phenomena occurring at the excitation and at the emission frequencies of the photon emitter. On the one hand, it depends on the local field at the excitation wavelength and the position where the photon emitter is located. On the other hand, the emission is modified due to the combined effect of (i) the local density of optical states to which an emitter can decay emitting radiation at the wavelength of emission; and (ii) the out-coupling of this emission to free space radiation in a particular solid angle.

The photon emitter may be a point emitter selected from the group comprising a rare earth ion, a dye molecule and a quantum dot. In principle any point emitter may be used in the present context where excitation may result in the emission of a photon.

The external energy source may for example be an electron emitter, an x-ray emitter or a gamma-ray emitter. In principle any external energy source may be used to excite the point emitter, such as an electron having sufficiently high energy, x-ray or gamma radiation, heat, injection of electron-hole pairs etc. Electrons may for example be emitted by a cathode ray tube (CRT), x-rays and gamma-rays may for example be provided from a vacuum tube for example Computed Tomography (CT) for X-rays and Positron Emission Tomography for gamma rays (PET).

According to one embodiment of the invention, the photon emitter is arranged at a distance from said plasmonic antenna array such that a majority of the emitted photons are emitted by the coupled system comprising said photon emitter and said plasmonic antenna array. When coupling occur between the emitted photon and the hybrid modes of the plasmonic antenna array, the energy of the photon is transferred to the array and the direction of the resulting emission is governed by the properties of the array. A high coupling efficiency of the emitted light into the resonance mode is desirable. In particular, it is desirable to maximize the coupling efficiency between the emitter and the plasmonic hybrid modes. By selectively positioning the photon emitters sufficiently close to the plasmonic antenna array, coupling efficiency may be increased, without entering into the regime of strong emitter-antenna coupling.

To achieve a high coupling efficiency, the distance between the photon emitter and one or more antenna elements of the plasmonic antenna array is preferably below 5 micrometers, more preferably below 2 micrometers. The suitable distance between the photon emitter and the antenna array can also be defined in terms of effective wavelengths corrected for the refractive index. The distance may then be up to 10 effective wavelengths, and in another embodiment up to 6 effective wavelengths. Alternatively or additionally the distance may advantageously be larger than 10 nanometers in order to avoid quenching.

In one embodiment of the invention, the photon emitter may advantageously be a wavelength converting particle. The photon emitter may then act as the wavelength converter in the wavelength conversion layer. Such a particle may also be referred to as a phosphor, or a dye particle.

Moreover, for a phosphor emitter, in addition to the directionality enhancement, due to the resonances at the emission frequency of the emitter, plasmonics also provide enhanced excitation efficiency/absorption cross section of the emitter due to resonant excitation at the pumping frequency.

According to one embodiment of the invention, the photon emitter, the first wavelength conversion layer and the second wavelength conversion layer may advantageously be configured and arranged such that white light is emitted by the illumination device. In many applications it is desirable to provide white light, such as for example for general purpose illumination.

In one embodiment of the invention, the first wavelength range may correspond to blue light, the second wavelength range may correspond to red light and the third wavelength range correspond to green light. White light can be formed by combining the colors red, green and blue. Furthermore, light emitting diodes emitting light in the blue wavelength range are well known and can be fabricated using conventional methods. Accordingly, wavelength conversion is required, either to convert all or at least a major portion of blue light directly into white light, or to convert blue light into red and green light which is then mixed to form white light. Blue light typically has wavelengths in the range of 450-495 nm, green light in the range of 520-570 nm and red light in the range of 590-740 nm.

In the case where the plasmonic antenna array is arranged in the second wavelength conversion layer and configured to support resonances corresponding to green light, a higher efficiency can be achieved as part of the blue light is converted to red before reaching the plasmonic antenna array, the reason being that the antenna elements of the plasmonic antenna array more easily absorb light having a higher frequency, i.e. a shorter wavelength, compared to light having longer wavelength. Therefore, lower absorption losses can be achieved by first converting a portion of blue light to red before it reaches the layer comprising the plasmonic antenna array.

In the case where the plasmonic antenna array is arranged in the first wavelength conversion layer and configured to support resonances corresponding to red light, a majority of the generated blue light is converted to red as it first reaches the first wavelength conversion layer. As most of the light in white light belongs to the red portion of the spectra, the red light may be beamed through the second wavelength conversion layer where a part of the blue light is converted to green, thereby, white light having a high directionality can be provided. Furthermore, the red light is preserved through the non-diffracting second layer which does not comprise a plasmonic antenna array.

According to one embodiment of the invention, the first wavelength range may correspond to blue light, the second wavelength range correspond to green light and the third wavelength range correspond to red light.

In the case where the plasmonic antenna array is arranged in the second wavelength conversion layer and configured to support resonances corresponding to red light, a part of the blue light is converted to green in the first wavelength conversion layer. Thereby, the green light is less absorbed in the second layer which leads to a higher efficiency. Accordingly, a strong beamed red emission is provided from the second wavelength conversion layer, and as mentioned above, as a majority of the light in white light belongs to the red part of the spectrum, a high efficiency in emission of white light can be achieved.

In the case where the plasmonic antenna array is arranged in the first wavelength conversion layer and configured to support resonances corresponding to green light, green has highest lumen per optical Watt and the obtained spatially structured green emission can therefore be used effectively in the application. The second wavelength conversion layer would convert only part of the green and blue, and maintain the beamed green emission, thereby increasing the efficiency. The red light (the major component in photons in white light) does not get diffracted by the array and losses are reduced.

According to one embodiment of the invention, the first wavelength conversion layer may comprise a first periodic plasmonic antenna array comprising a plurality of individual antenna elements arranged in an antenna plane, the first plasmonic antenna array being configured to support plasmonic-photonic lattice resonances at a frequency range corresponding to the second wavelength range, such that light emitted from the first plasmonic antenna array has an anisotropic angle distribution; and the second wavelength conversion layer may comprise a second periodic plasmonic antenna array comprising a plurality of individual antenna elements arranged in an antenna plane, the plasmonic antenna array being configured to support plasmonic-photonic lattice resonances at a frequency range corresponding to the third wavelength range, such that light emitted from the second plasmonic antenna array has an anisotropic angle distribution.

Two different arrays allow an independent control of the angular range in which red and green light are directed. It can be assumed that light generated in a flat conversion layer is emitted isotropically. In turn, light generated in a conversion layer comprising a plasmonic antenna array will show an anisotropic angle distribution. In order to produce light with the right color point in a desired solid angle, both green and red light should be out-coupled in the same angle range. This will only happen if two different arrays are designed to tailor the emission of the green and red conversion layers independently. Specifically, the array employed in combination with the green layer must have a slightly shorter lattice constant than the one employed to tailor the emission of the red layer. An adequate design of the two different lattices would also allow the beaming of the green and the red light into very different directions. In summary, an additional metallic array provides an additional degree of freedom in the design of the directionality of the emission and the color appearance in lighting devices.

When two plasmonic systems are stacked one has to consider that the second array can diffract the beamed emission from the first array, therefore the angle distribution of the first array should take into account the extra angular distribution that will take place due to the second array. However, the diffraction may also be used to an advantage by forming a final desired beam shape obtained by diffraction of the first beam by the second array, which yields the desired shape.

In one embodiment of the invention, where a plasmonic antenna array is arranged in both the first and the second wavelength conversion layer, the second wavelength range may correspond to red light and the third wavelength range may correspond to green light. A majority of the blue light is converted to red light in the first layer which is then beamed through the second layer. As the plasmonic array in the second layer configured to have resonance frequency corresponding to green light has a period which is shorter than the wavelength of visible light, no diffraction of red light will occur in a direction close to the normal to the plane of the array which leads to that the red emission is mainly preserved as it propagates through the second layer.

In one embodiment of the invention, where a plasmonic antenna array is arranged in both the first and the second wavelength conversion layer, the second wavelength range may correspond to green light and the third wavelength range may correspond to red light. Most of the blue light will be converted into green light as the green light is also used as the pump wavelength for the second array to generate red. As most of the photons are green, the losses in the metal of the second array are less compared to if pumping with blue light. The beamed emission of green light from the first wavelength conversion layer can next be advantageously used in the second wavelength conversion layer to convert part the green light to red light as the pump green is limited in angle and wavelength range, which makes is easier to optimize the second array for pump enhancement and conversion efficiency.

According to one embodiment of the invention, a wavelength conversion medium configured to emit green light may advantageously comprise YAG:Ce (cerium doped yttrium-aluminum garnet), LuAG:Ce (cerium doped lutetium-aluminum garnet), europium doped thiogalate sulphides, quantum dots, organic dyes or line emitters. However, other types of wavelength conversion materials known by the person skilled in the art may equally well be used.

In one embodiment of the invention, a wavelength conversion medium configured to emit red or green light may advantageously comprise quantum dots, organic dyes or line emitters in the form of an ion of a rare earth element. It is important to control the bandwidth of the emission of the wavelength conversion layer in relation to the sensitivity curve of the human eye in order to achieve a good color appearance. In general, the emission peak of the wavelength conversion medium should overlap with the desired final emission from the system, e.g. saturated green and red. Furthermore, the peak wavelength of the wavelength conversion medium should be chosen such that it overlaps with the optimal efficiency of the plasmonic antenna array, e.g. the desired peak wavelength and emission angle of the array.

In one embodiment of the invention, a plasmonic antenna array configured to support plasmonic-photonic lattice resonances at a frequency range corresponding to red light may advantageously comprises antenna elements arranged in a square array with a pitch in the range of 350-450 nm, each antenna element having a height in the range of 100-200 nm and a diameter in the range of 100-200 nm. A square array may also be referred to as a square lattice.

Furthermore, a plasmonic antenna array configured to support plasmonic-photonic lattice resonances at a frequency range corresponding to red light may also comprise antenna elements arranged in a hexagonal array, i.e. a hexagonal lattice, with a pitch in the range of 400-500 nm, each antenna element having a height in the range of 100-200 nm and a diameter in the range of 100-200 nm.

Furthermore, a plasmonic antenna array configured to support plasmonic-photonic lattice resonances at a frequency range corresponding to red light may also comprise antenna elements arranged in a hexagonal array, i.e. a hexagonal lattice, with a pitch in the range of 350-375 nm, each antenna element having a height in the range of 100-200 nm and a diameter in the range of 100-200 nm. This will provide structured emission in a narrow range under angles of ~40-50° from the surface normal.

Moreover, a plasmonic antenna array configured to support plasmonic-photonic lattice resonances at a frequency range corresponding to green light may advantageously comprise antenna elements arranged in a square array with a pitch in the range of 300-400 nm, each antenna element having a height in the range of 100-200 nm and a diameter in the range of 100-200 nm.

Moreover, a plasmonic antenna array configured to support plasmonic-photonic lattice resonances at a frequency range corresponding to green light may advantageously comprise antenna elements arranged in a hexagonal array with a pitch in the range of 350-450 nm, each antenna element having a height in the range of 100-200 nm and a diameter in the range of 100-200 nm.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing example embodiments of the invention, wherein.

DETAILED DESCRIPTION OF PREFERRED EMBODIMENTS OF THE INVENTION

Figure 1:
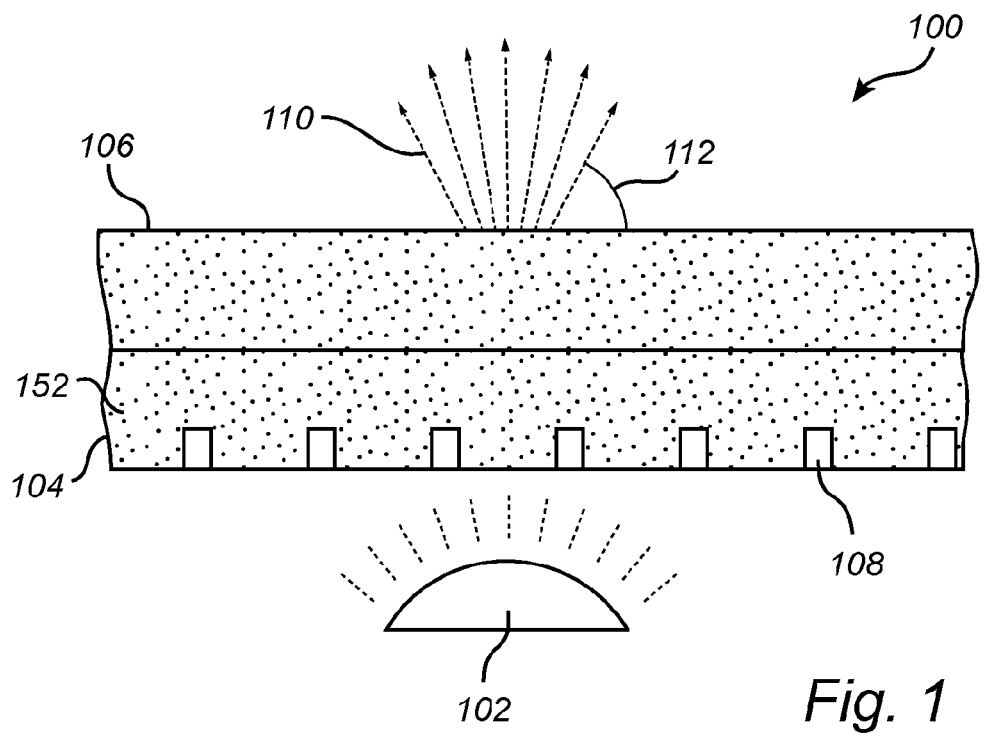
FIG. 1 schematically illustrates an illumination device according to an embodiment of the invention.

The present invention will now be described more fully hereinafter with reference to the accompanying drawings, in which exemplary embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

Figure 4:
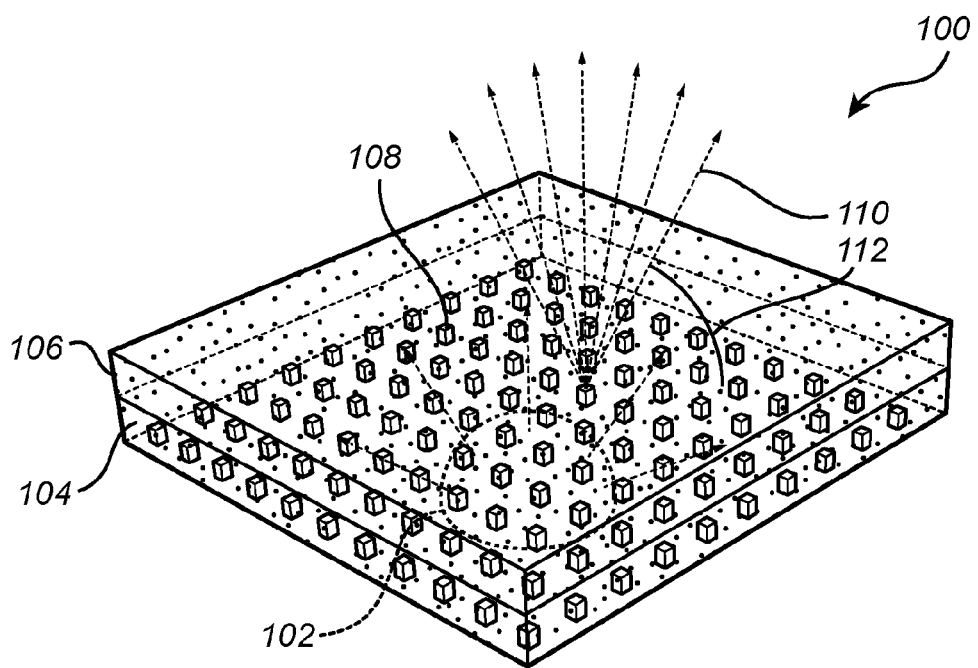
FIG. 4 schematically illustrates an illumination device according to an embodiment of the invention.

FIG. 1 is a schematic illustration of an illumination device 100 comprising a plurality of photon emitters 152 arranged in close proximity to a periodic plasmonic antenna array comprising a plurality of individual antenna elements 108 arranged in an antenna array plane as illustrated by FIG. 4.

The distance between the photon emitter 152 and one or more antenna elements of the plasmonic antenna array is preferably below 5 micrometers, in another embodiment below 10 effective wavelengths and in yet another embodiment below 6 effective wavelengths. Additionally, or alternatively, the distance may advantageously be larger than 10 nanometers in order to avoid quenching. The distance between the photon emitter and the plasmonic antenna array can in general be very well controlled using known manufacturing methods. The distance between the photon emitter and the antenna element(s) of the antenna array may be measured from any direction, for example to the top, side or bottom of the antenna element(s).

The photon emitter 102 is here shown as a point emitter which is capable of being excited by the external energy source 102. The point emitter may for example be a rare earth ion, a dye molecule or a quantum dot. The external energy 102 source for exciting the point emitter may for example be an electron emitter, an x-ray emitter or a gamma-ray emitter, or the point emitter may be excited through injection of electron-hole pairs.

In principle any external energy source may be used to excite the point emitter, such as an electron having sufficiently high energy, x-ray or gamma radiation, heat, injection of electron-hole pairs etc. Electrons may for example be emitted by a cathode ray tube (CRT), x-rays and gamma-rays may for example be provided from a vacuum tube, for example Computed Tomography (CT) for X-rays and Positron Emission Tomography for gamma rays (PET).

However, the photon emitter may equally well be an active component such as an LED or a solid state laser, where electric energy is provided from an external energy source to achieve photon emission form the component.

FIG. 1 further illustrate that the photon emitters 152 are arranged in a first wavelength conversion layer 104 arranged adjacent to the energy source 102 to receive energy from the energy source 102 such that the photon emitters 152 may absorb energy and reach an excited state. The photon emitters are further configured to convert light from the first wavelength range to a second wavelength range. The illumination device 100 further comprises a second wavelength conversion layer 106 arranged adjacent to the first wavelength conversion layer 104 and configured to convert light from the second wavelength range to a third wavelength range. The second 106 wavelength conversion layer comprises a wavelength converting medium in the form of molecules or particles for converting light from one wavelength to another. Different types of wavelength converting materials known to person skilled in the art may be used. Wavelength converting materials may also be referred to as fluorescent materials, phosphors or dyes. It is also possible to use quantum dots or rare earth ions as a wavelength converting material. Herein, the energy source 102 may for example be a light source 102 illustrated as separately arranged light emitting device, such as a light emitting diode or a laser, arranged separately and at a distance from the wavelength conversion layers and from the remainder of the illumination device. However, the light source 102 may equally well be integrated such as in a semiconductor light emitting diode formed in a semiconductor substrate.

The illumination device 100 further comprises a periodic plasmonic antenna array comprising a plurality of individual antenna elements 108 arranged in an antenna array plane. The antenna array is here arranged within the first wavelength conversion layer 104 to receive light emitted from the light source 102 and the first wavelength converting medium.

Furthermore, the antenna array is configured to support surface lattice resonances at the second wavelength, emitted by the first wavelength converting medium, arising from diffractive coupling of localized surface plasmon resonances in the individual antenna elements.

It is further illustrated in FIG. 1 how light 110 is emitted from a light emitting surface of the illumination device 100 within a limited angular range 112.

Figure 2:
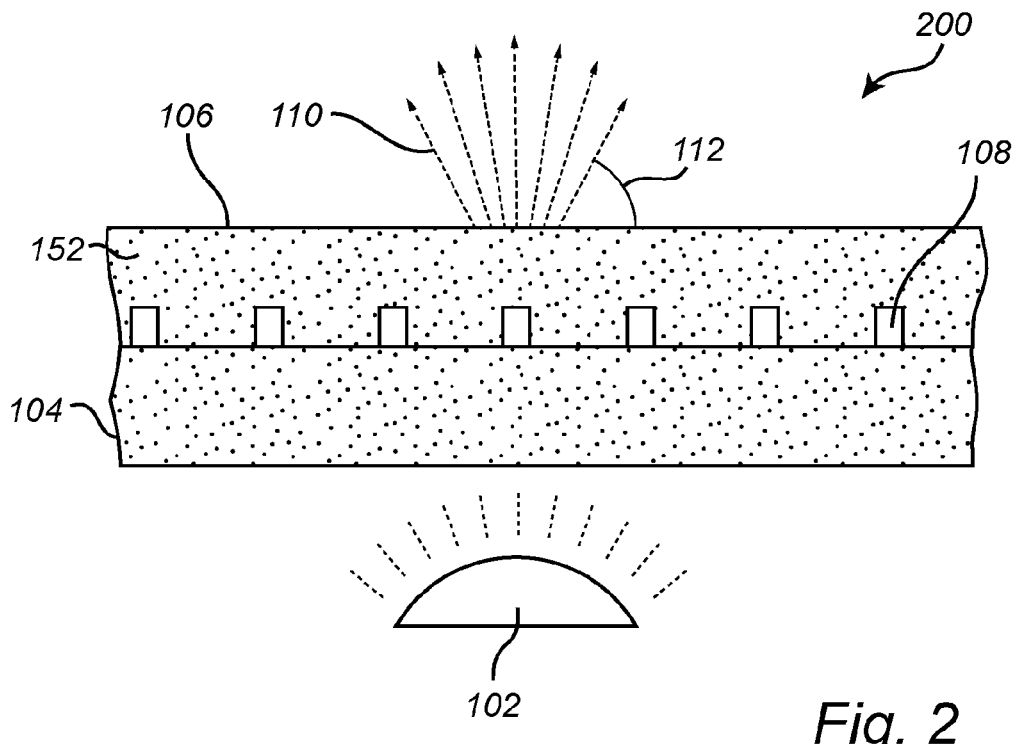
FIG. 2 schematically illustrates an illumination device according to an embodiment of the invention.

FIG. 2 schematically illustrates an illumination device 200 where a periodic plasmonic antenna array comprising a plurality of individual antenna elements 108 is arranged within the second wavelength conversion layer 106.

Figure 3:
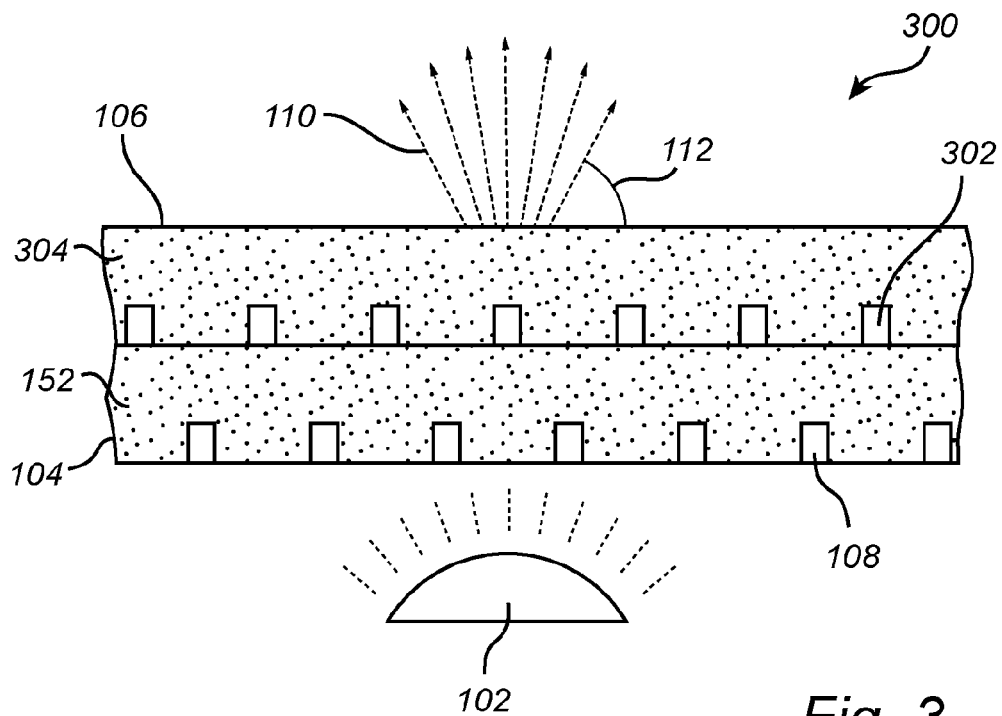
FIG. 3 schematically illustrates an illumination device according to an embodiment of the invention.

FIG. 3 schematically illustrates an illumination device 300 where a first periodic plasmonic antenna array comprising a plurality of individual antenna elements 108 is arranged within the first wavelength conversion layer 104 and a second periodic plasmonic antenna array comprising a plurality of individual antenna elements 302 is arranged within the second wavelength conversion layer 106. Photon emitters 304 may be arranged also in the second wavelength conversion layer 106, in a similar manner as described above with respect to the first wavelength conversion layer 104. Thereby, each plasmonic antenna array can be tailored to emit light within a predetermined wavelength range which may be a subset of the visible spectrum so that an overall emission from the illumination device is provided as a homogeneous emission of white light having an angle distribution determined by the configuration of the antenna arrays. As is readily realized, any number of differently configured antenna arrays according to various embodiments of the invention may be combined to achieve the desired emission properties.

FIG. 4 is a perspective view of the illumination device 100 illustrated in FIG. 1 where a plasmonic antenna array is arranged in the first wavelength conversion layer 104.

In FIGS. 1-4 the antenna elements 108, 302 are illustrated as blocks having a square cross section, however, the antenna elements may equally well have other shapes such as for example a polygonal or circular cross section. Furthermore, an antenna element may for example be provided in the form of an aluminum nanoparticle.

A plasmonic antenna array configured to support plasmonic-photonic lattice resonances at a frequency range corresponding to red light may for example comprise antenna elements having a height of approximately 150 nm and a base side (or diameter) of 140 nm arranged in a square array having a pitch of approximately 400 nm.

A plasmonic antenna array configured to support plasmonic-photonic lattice resonances at a frequency range corresponding to red light may also comprise antenna elements having a height of approximately 150 nm and a base side (or diameter) of 140 nm arranged in a hexagonal array having a pitch of approximately 450 nm.

A plasmonic antenna array configured to support plasmonic-photonic lattice resonances at a frequency range corresponding to green light may for example comprise antenna elements having a height of approximately 150 nm and a base side (or diameter) of 140 nm arranged in a square array having a pitch of approximately 345 nm.

The above examples describe geometries for plasmonic antenna arrays providing beamed emission close to the normal of the array plane.

Advantageously, the illumination device can be configured so that the angle range 112 and wavelength spectra of emitted light 110 are different depending on the desired application.

Even though the invention has been described with reference to specific exemplifying embodiments thereof, many different alterations, modifications and the like will become apparent for those skilled in the art. For example, the plasmonic antenna array may be configured in many different ways to achieve different angle distributions of emitted light. Furthermore, the illumination device may also be configured to emit light of different wavelengths or within different wavelength ranges. In particular, although the illumination device mainly has been described with reference to emission of visible light, various embodiments of the invention are equally applicable in applications where it may be desirable to emit light in the ultraviolet or infrared spectra. Also, it should be noted that parts of the system may be omitted, interchanged or arranged in various ways, the illumination device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. An illumination device comprising:
   an energy source configured to excite a photon emitter such that said photon emitter emits a photon when returning to a relaxed state;
   a first wavelength conversion layer comprising a first wavelength converting medium configured to convert light within a first wavelength range into light within a second wavelength range; and
   a second wavelength conversion layer comprising a second wavelength converting medium configured to convert light within said second wavelength range into light within a third wavelength range;
   wherein at least one of said first wavelength conversion layer and said second wavelength conversion layer comprises a periodic plasmonic antenna array comprising a plurality of individual antenna elements arranged in an antenna plane; and
   wherein said wavelength converting medium in said wavelength conversion layer in which said periodic plasmonic antenna array is arranged comprises photon emitters arranged in close proximity of said periodic plasmonic antenna array such that at least a portion of photons emitted from said wavelength conversion layer are emitted by a coupled system comprising said photon emitter and said periodic plasmonic antenna array;
   said periodic plasmonic antenna array being configured to support plasmonic-photonic lattice resonances at a frequency range corresponding to the wavelength range of said photon emitter in said wavelength conversion layer in which said periodic plasmonic antenna array is arranged, such that light emitted from said periodic plasmonic antenna array has an anisotropic angle distribution.

2. The illumination device according to claim 1, wherein said photon emitter is arranged at a distance from said periodic plasmonic antenna array such that a majority of the emitted photons are emitted by the coupled system comprising said photon emitter and said periodic plasmonic antenna array.

3. The illumination device according to claim 1, wherein said photon emitter is a wavelength converting particle.

4. The illumination device according to claim 1, wherein said photon emitter, said first wavelength conversion layer and said second wavelength conversion layer are configured and arranged such that white light is emitted by said illumination device.

5. The illumination device according to claim 1, wherein said first wavelength range corresponds to blue light, said second wavelength range corresponds to red light and said third wavelength range corresponds to green light.

6. The illumination device according to claim 1, wherein said first wavelength range corresponds to blue light, said second wavelength range corresponds to green light and said third wavelength range corresponds to red light.

7. The illumination device according to claim 1, wherein said first wavelength conversion layer comprises a first periodic plasmonic antenna array comprising a first plurality of individual antenna elements arranged in a first antenna plane, said first periodic plasmonic antenna array being configured to support plasmonic-photonic lattice resonances at a first frequency range corresponding to said second wavelength range, such that light emitted from said first periodic plasmonic antenna array has a first anisotropic angle distribution; and
   wherein said second wavelength conversion layer comprises a second periodic plasmonic antenna array comprising a second plurality of individual antenna elements arranged in a second antenna plane, said second periodic plasmonic antenna array being configured to support plasmonic-photonic lattice resonances at a second frequency range corresponding to said third wavelength range, such that light emitted from said second periodic plasmonic antenna array has a second anisotropic angle distribution.

8. The illumination device according to claim 7, wherein said second wavelength range corresponds to red light and said third wavelength range corresponds to green light.

9. The illumination device according to claim 7, wherein said second wavelength range corresponds to green light and said third wavelength range corresponds to red light.

10. The illumination device according to claim 1, wherein said wavelength conversion medium is configured to emit green light and comprises YAG:Ce, LaAG:Ce, europium doped thiogalate sulphides, quantum dots, organic dyes or line-emitters.

11. The illumination device according to claim 1, wherein said wavelength conversion medium is configured to emit red light and comprises quantum dots, organic dyes or line emitters.

12. The illumination device according to claim 1, wherein said periodic plasmonic antenna array is configured to support plasmonic-photonic lattice resonances at a frequency range corresponding to red light, said periodic plasmonic antenna array comprising antenna elements arranged in a square array with a pitch in the range of 350-450 nm, each antenna element having a height in the range of 100-200 nm and a diameter in the range of 100-200 nm.

13. The illumination device according to claim 1, wherein said periodic plasmonic antenna array is configured to support plasmonic-photonic lattice resonances at a frequency range corresponding to red light, said periodic plasmonic antenna array comprising antenna elements arranged in a hexagonal array with a pitch in the range of 400-500 nm, each antenna element having a height in the range of 100-200 nm and a diameter in the range of 100-200 nm.

14. The illumination device according to claim 1, wherein said periodic plasmonic antenna array is configured to support plasmonic-photonic lattice resonances at a frequency range corresponding to green light, said periodic plasmonic antenna array comprising antenna elements arranged in a square array with a pitch in the range of 300-400 nm, each antenna element having a height in the range of 100-200 nm and a diameter in the range of 100-200 nm.

15. The illumination device according to claim 1, wherein said periodic plasmonic antenna array is configured to support plasmonic-photonic lattice resonances at a frequency range corresponding to green light, said periodic plasmonic antenna array comprising antenna elements arranged in a hexagonal array with a pitch in the range of 350-450 nm, each antenna element having a height in the range of 100-200 nm and a diameter in the range of 100-200 nm.

* * * * *